United States Patent [19]

McNulty

[11] Patent Number: 4,953,059

[45] Date of Patent: Aug. 28, 1990

[54] SPRING LOADED MULTI-WEDGE CARD RETAINER

[75] Inventor: Christopher T. McNulty, Terryville, Conn.

[73] Assignee: United Technologies Corporation, Hartford, Conn.

[21] Appl. No.: 836,935

[22] Filed: Mar. 6, 1986

[51] Int. Cl.$^5$ .............................................. H05K 7/20
[52] U.S. Cl. ................................... 361/386; 165/80.3; 211/41; 361/415
[58] Field of Search ............... 361/386, 387, 388, 389, 361/382, 415; 165/80, 185; 211/41; 174/16 HS; 339/17 L, 17 LC, 17 LM, 17 M, 17 MP

[56] References Cited

U.S. PATENT DOCUMENTS

| | | | |
|---|---|---|---|
| 4,298,904 | 11/1981 | Koenig | 361/386 |
| 4,318,157 | 3/1982 | Rank | 361/386 |
| 4,414,605 | 11/1983 | Chino | 361/386 |
| 4,480,287 | 10/1984 | Jensen | 361/386 |

FOREIGN PATENT DOCUMENTS

| | | | |
|---|---|---|---|
| 2102209 | 1/1983 | United Kingdom | 361/386 |
| 2103020 | 2/1983 | United Kingdom | 361/386 |

*Primary Examiner*—Gerald P. Tolin
*Attorney, Agent, or Firm*—Francis J. Maguire, Jr.

[57] ABSTRACT

A plurality of trapezoidal wedges in a channel for retaining a PCB heat sink are held in place by spring force provided by a compression spring inside the bottom end wedge. The compression forces provided by the spring are mainly effective to prevent twisting of wedges on the absence of a heat sink and to provide at least some degree of heat transfer between the heat sink and the chassis even if the responsible technician neglects to torque down the wedges.

9 Claims, 1 Drawing Sheet

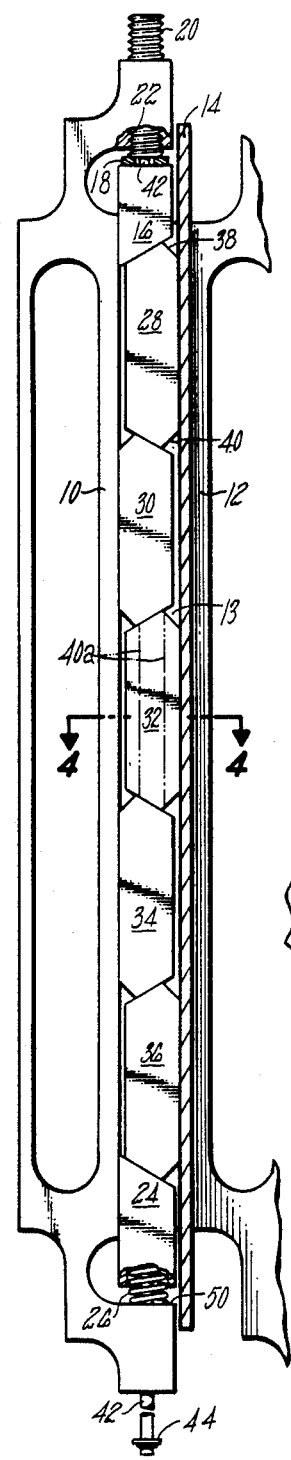
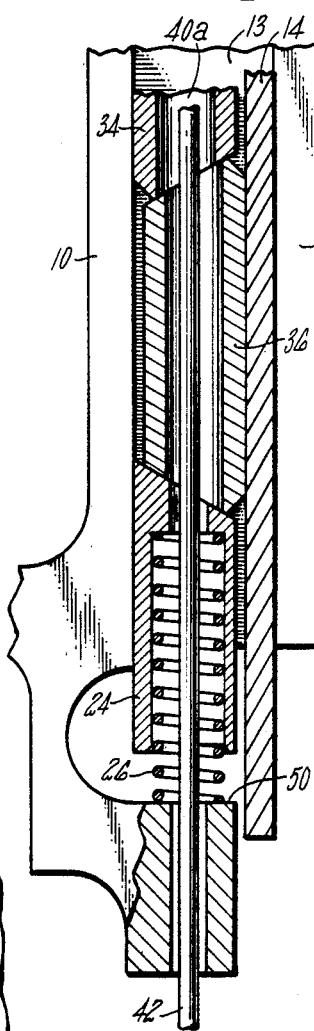
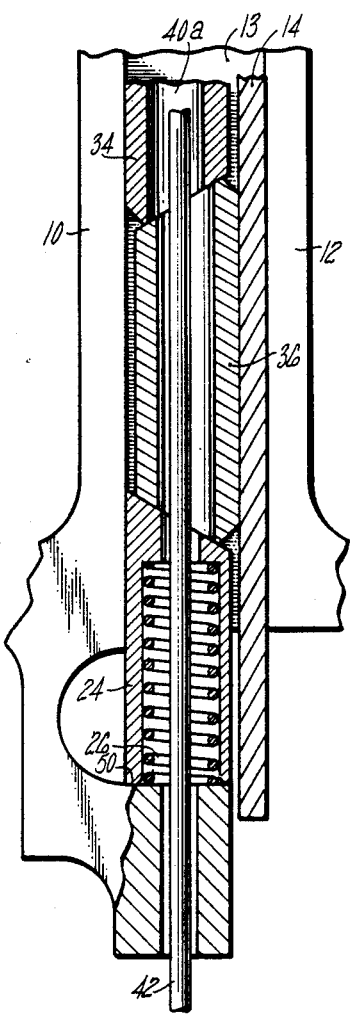
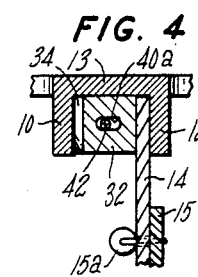

SPRING LOADED MULTI-WEDGE CARD RETAINER

DESCRIPTION

1. Technical Field

The invention herein is directed toward the technology of electronic packaging, and particularly toward electronic printed circuit board or card retainers in electronic packages.

2. Background Art

Closely spaced electronic components on printed circuit boards arranged in parallel in an electronic chassis require an environment in which the temperature is controlled below a selected level. The prior art has recognized the advantage of conducting some of the heat generated by the electronic components away through a heat sink upon which the printed circuit board is mounted. Significant cooling is thus achieved by establishing a thermal conduction path from the electronic card through its heat sink to a heat exchanger in the chassis holding the card. This thermal path extends from the actual components on the card through a bond line attaching it to a chem-milled aluminum heat sink. The heat sink is held in place by a card retainer in the chassis through which heat is conducted to the chassis wall and finally to the heat exchanger. The thermal resistance through the card retainer is a significant portion of the overall thermal resistance. Various approaches have been suggested in the prior art for minimizing the thermal resistance in the retainer. Among the prior art approaches to card retainers are included multi-wedge card retainers as exemplified in various U.S. Pats. including each of the following.

U.S. Pat. No. 4,298,904, issued to Koenig on Nov. 3, 1981 and assigned to the Boeing Company, entitled ELECTRONIC CONDUCTION COOLING CLAMP, discloses means for clamping a printed circuit board to a chassis with improved heat transfer. The chassis, which acts as a heat sink, is provided with elongated slots which receive the opposite edges of a heat sink sandwiched between insulating printed circuit layers of the printed circuit card. Disposed within each slot is a plurality of wedges which, when tightened, make contact with three surfaces thereby providing a means for contacting an additional surface, since the prior art wedges only made contact with two surfaces. Thus, heat conduction is improved and temperature is reduced. The wedge-shaped elements are spaced along the shank of a screw which threads into a threaded hole extending though the last of the wedge-shaped elements such that when the screw is turned, the elements are drawn together or separated, depending on the direction of rotation of the screw. The facing end surfaces of the wedge-shaped elements are slanted in two directions, preferably along 45° angles. In this manner, as the wedge-shaped elements are drawn together, they tend to spread apart along a 45° angle whereby contact is made with two surfaces at right angles to each other. See column 3, lines 59-68 and column 4, lines 1-3 for a detailed description of the movement of the elements as the screw is tightened.

U.S. Pat. No. 4,318,157, issued to Rank on March 2, 1982, assigned to Control Data Corporation, entitled APPARATUS FOR MOUNTING CIRCUIT CARDS, discloses apparatus for mounting a printed circuit card to a chassis adapted to support an array of circuit cards. In this case, the card itself carries a plurality of wedges or "ramps" held together by a long screw. Adjacent ramps have oblique and parallel mating surfaces such that tighteninq the screw moves adjacent ramps in opposite directions laterally which causes alternate ramps and the circuit card aqainst opposing channel walls in the chassis to frictionally secure the circuit card in the chassis. The disclosure recognizes the importance of heat dissipation and indicates that the use of ramps maximizes the transfer of heat from each circuit card to the chassis. See column 5, lines 40-68 and column 6, lines 1-6 for a discussion of the clamping action.

U.S. Pat. No. 4,414,605 issued on Nov. 8, 1983 to Chino and assigned to the United States as represented by the Secretary of the Navy, and entitled POSITIVE LOCKING MECHANISM, discloses a mechanism for securing a securing a plug-in electronic module in a chassis. Again, a threaded screw is passed through a plurality of wedges carried on a printed circuit board. The difference, in this case, is that a need was seen to insure that there is positive visual indication as to whether or not the wedges have been moved to their desired position and also the desirability of eliminating the need for special tools which may be easily lost and which may not be available when needed. The locking mechanism consists of a threaded screw similar to the long screws used in the prior art except that a pivotal driver blade is provided for turning the threaded element. After the threaded element is fully engaged in the tapped hole, the driver blade is pivoted and a cam thereon actuates the wedges which engage the electronic printed circuit board and the chassis to provide a good thermal interface. A spring 38 is positioned between a spring compressor 37 and the top of wedge 23.

U.S. Pat. No. 4,480,287 issued Oct. 30, 1984 to Jensen and assigned to Raytheon Company, entitled MODULE RETAINER APPARATUS discloses an improved electronic circuit module retainer apparatus having interlocking, wedge-shaped components which are slotted and keyed together to prevent the wedges from turning out of position when the longitudinal screw is not tightened.

All of these prior art retainers provide improved heat transfer. Except Chino, all require a tool for torquing down a bolt for supplyinq compression. If the tool is not available, if the technician forgets to tighten the bolt, or if, as in Chino, the blade is not pivoted, there is no good thermal contact whatsoever.

DISCLOSURE OF THE INVENTION

An object of the present invention is to provide improved heat transfer and structural support characteristics for untorqued card guides. Another object of the present invention is elimination of wedge rotation when the heat sink is not present.

According to the present invention, a printed circuit board (PCB) heat sink in the form of a rectangular plate may be secured in a pair of parallel slots or channels in a PCB chassis, each channel containing a plurality of rectangular-tubed six-sided wedges, each wedge having the shape of a long tube having a rectangular or square cross section and having its ends slant cut such that one of the longitudinal cross sections of the wedge has a trapezoidal shape. The wedges are aligned end-to-end within a rectangular, open-sided tubular channel such that the trapezoidal cross sections face outwardly from the open side of the channel and are alternately flipped one way or the other along the length of the aligned wedges such that similarly slanted ends of adjacent wedges mate and slidably engage. The channel is wider than the cross section of the wedge tubes to permit lateral movement of the wedges. The plurality of wedges includes an entrance wedge settable in position at the entrance end of the channel where the PCB heat sink is designed for insertion and also includes a moveable hollow end wedge, open at one end, at the other end of the channel. A spring is provided for insertion inside the moveable hollow end wedge for providing a preinsertion force, prior to slidably inserting a PCB heat sink between one of the opposite channel sides and one set of alternate wedges. The preinsertion spring force slidably forces the ends of the wedges against one another, thereby causing oppositely directed lateral movement of alternate wedges. The long sides of alternate wedges are forced against opposite channel sides such that upon insertion of a PCB heat sink between one of the opposite channel sides and one set of alternate wedges, part of the spring force will be exerted by one set of alternate wedges against a fully inserted heat sink and part of the spring force will be exerted by the other remaining set of alternate wedges aqainst the other opposite side of the channel. In this way, the heat sink will be held firmly in place and heat may be conducted through the wedges even in the absence of any torque-down by a technician In further accord with the present invention, entrance wedge may be torqued down using a set screw held in place with respect to the chassis.

In still further accord with the present invention, each of the plurality of wedges may have an oversized bore or a slot for receiving a wire which extends from one end of the channel to the other through the wedges. The wire may be anchored in each end of the channel for loosely holding the wedges in longitudinal alignment and for preventing wedges from falling out of the channel.

In still further accord with the present invention, the edges at the ends of the longest side of each trapezoidal wedge may be chamfered. In lieu of chamfering both edges, only the edge closest to the entrance wedge of each trapezoidal wedge (for initial contact with a heat sink being inserted) may be chamfered.

The spring loaded feature of the multi-wedge card retainer disclosed herein provides improvements to the existing art. The areas of application that are aided most by this improvement are related to assembly and repair of electronic equipment. As in many industries where equipment needs renair, here also, human error accounts for a certain percentage of equipment failure. In the case of the multi-wedge card retainer, the device is only effective if the service personnel torques the set screw. If the set screw is not secured during servicing, a poor thermal conduction path from the printed circuit board to the chassis exists. This, in turn, causes the electrical component temperatures of the PCB to exceed design limits. Eventually, one or more of these electrical components will fail, causing the equipment to be pulled out of service. The spring loaded feature significantly decreases the occurrences of this type of failure. In addition, the present invention teaches that placement of the spring at the bottom of the channel eases insertion of the PCB, which would be considerably more difficult if the spring were located at the top of the channel. In addition, twisting of wedges in the absence of a PCB is prevented.

These and other objects, features and advantages of the present invention will become more apparent in light of the detailed description of a best mode embodiment thereof, as illustrated in the accompanying drawing.

BRIEF DESCRIPTION OF THE DRAWING

FIG. 1 is an illustration of a spring-loaded multi-wedge card retainer, according to the present invention;

FIG. 2 is an illustration of the spring-loaded bottom wedge in the channel of FIG. 1 shown in the free position;

FIG. 3 is an illustration similar to FIG. 2 except that the wedges are shown in the torqued position; and FIG. 4 is a section view of a channel in a chassis wall along lines 4-4 of FIG. 1.

BEST MODE FOR CARRYING OUT THE INVENTION

Referring to FIG. 1 of the drawing, a spring-loaded multi-wedge PCB retainer, according to the present invention, is illustrated. A plurality of rectangular, tubular channels are machined into the chassis walls. Each channel has a pair of opposing walls 10, 12 joined at the back of the channel by another wall 13 shown in FIG. 4 as part of the chassis. Thus, the rectangular channel has a "C" shaped cross-section with one open side for receiving a PCB heat sink 14 shown in cross-section in both FIGS. 1 and 4. FIG. 4 additionally shows a printed circuit board 15 and a typical electronic component 15a attached thereto.

A plurality of wedges are shown in FIG. 1 aligned end-to-end within the channel. A top wedge 16 includes a bearing washer 18 attached to the top thereof for bearing against a set screw 20 which is threaded into a threaded part 22 of the chassis, which may be machined out of the chassis at the same time as the channels. The bearing washer 18 may be of steel while the wedge 16 may be of aluminum so that a steel set screw will be able to bear on the top wedge without cutting into the softer aluminum. The set screw 20 may be torqued down with an Allen wrench or any other similar type tool which would be readily available to an electronics technician.

A bottom wedge 24 sits at the bottom of the channel. It is open ended at the bottom-most end and contains a cavity for receiving a compression spring 26 which extends out of the bottom of the wedge in the untorqued or free position of the apparatus.

A plurality of intermediate wedges 28, 30, 32, 34, and 36 are aligned end-to-end between the too wedge 16 the bottom wedge 24. Each wedge consists of a long rectangular tube, which may be square, having two opposing rectanqular faces and two opposing congruent trapozoidal faces formed by slant cuts at the ends of each wedge forming end faces which mate with similarly slanted end faces of adjacent wedges in the channel. The angles may be of any convenient slant but are preferably of a slant of approximately 60°, but which may be in the range of approximately 45° to 75°. Adjacent wedges are in "flipped" relation to one another. In other words, the long rectangular faces of alternate wedges bear against the same channel wall. For example, the long rectangular faces of wedges 28, 32, and 36 bear against channel wall 12 (in the absence of an inserted heat sink 14) while the long rectangular faces of wedges 30 and 34 bear against channel wall 10.

The edges 38, 40 of each wedge at the ends of each long rectangular face may be chamfered in order to facilitate insertion of the heat sink 14. Although it would only be necessary to chamfer edge 38 in order to thus facilitate entry of the heat sink, it would be easier, manufacturing-wise, to chamfer both ends of the long face. Then there would be no unnecessary confusion during assembly of chamfered versus non-chamfered edges. It would also be unnecessary to have chamfered edges on wedges 30, 34 but, for manufacturinq and assembling simplicity, it is easier to just manufacture all the wedges identically. Of course, it is within the spirit and scope of this aspect of the invention to chamfer the first edge of each wedge which comes into contact with a heat sink being inserted and any variations of chamfering which include this aspect of the invention.

Each wedge may have a longitudinal slot or an oversized bore, including the end wedges, which may have either an oversized longitudinal counter-bore, a simple oversized bore or slot as shown in phantom lines 40a for receiving a wire 42 which extends along the entire length of the stacked wedges and which holds the wedges in place so that the wedges do not fall out of the channel. The wedge retaining wire 42 is terminated in the set screw 20 and has a wire retaining washer 44 attached to the other end.

It is an important teaching of the present invention that, in the absence of any torquing by an electronics technician, any PCB circuit board inserted between the plurality of wedges and channel wall 12 will be held firmly in place anyway by the compression force provided by spring 26. The spring pushes wedge 24 upwardly against the bottom slant face of wedge 36 which thereby has its long rectangular face forced up against the heat sink 14 by virtue of the transmission of this compression spring force along the entire line of wedges all the way to the top wedge 16. Each successive wedge is forced alternately against either the heat sink or the other channel wall 10 by virtue of the sliding engagement of each end face of each wedge causing lateral movement in opposite directions of each alternate wedge. Thus, wedges 36, 32, and 28 bear up against heat sink 14 while wedges 30, 34 bear up aqainst channel wall 10. Even in the absence of the insertion of a heat sink, the individual wedges are still forced up against or close to opposite sidewalls 10, 12 of the channel. It will be seen by reference to FIG. 2, that if the heat sink 14 were removed, wedge 36 would not quite make contact with channel wall 12 before being held back by wire 42. However, if the slot or bore in wedge 36 were larqe enough, then the wedge would make contact with wall 12. Thus, the wedges are in a permanent state of compression and are held in place by virtue of this compression combined with the presence of the retaining wire 42. There is thus no tendency for the wedges to get inadvertently turned around in the wrong direction or to fall out of the channel once they are set up correctly during initial assembly.

It is also an important teaching of the present invention that the spring should be at the lower end of the channel since this aids in easy insertion of the PCB heat sink. If the compression spring were instead in top end wedge 16, the insertion of the heat sink would be considerably more difficult. This is due in part to the fact that the wedges would be forced to expand upwardly against the direction of the inserting heat sink. Additionally, more wedges would be forced to expand upwardly as the heat sink nears the final stage of insertion. When the heat sink makes contact with the chamfer of wedge 36, wedge 36 will in turn force wedges 34, 32, 30, 28 and 16 to be forced upwards against the force of the compression spring. There is considerablY more frictional resistance associated with this insertion as compared to the spring located at the bottom where only wedge 36 and 24 are forced to expand longitudinally during the final stage of heat sink insertion.

Referring now to FIG. 2, an enlarged view of the illustration of FIG. 1, near the bottom end of the channel is shown. The wedges are in an untorqued, "free" position, where the electronics technician has not yet torqued down the set screw 20 of FIG. 1. As may be seen from the position of the end wedge 24, the compression spring 26 extends out of the cavity within end wedge 24. In that case, the long rectangular face of wedge 36 bears up against heat sink 14 by virtue of the spring force provided by compression spring 26. Similarly, the long face of wedge 34 bears up against channel wall 10 by virtue of the transmission of this spring force from wedge 36 along the top slanted face thereof. It will be observed that additional and stronger compressive forces may be supplied by torquing down the set screw 20 of FIG. 1 and forcing the end wedge 24 to occupy a lower position within the channel as shown in FIG. 3. In FIG. 3, all of the other wedges have also slid down into the channel and moved further apart laterally so as to increase the compressive forces exerted against the channel walls, thereby increasing the heat transfer capabilities of the heat sink channel wall 12 interface. With the bottom wedge 24 seated at the bottom of the channel against end piece 50, it is evident that additional compressive forces exerted by torquing down the set screw after this point will provide much increased lateral compression with a resulting greatly increased heat transfer. Of course, there is also heat transfer capability provided between channel wall 10 and the long faces of wedges 34 and 30, although this is not as significant as the interface provided by wedges 28, 32, and 36.

Similarly, although the invention has been shown and described with respect to preferred embodiments thereof, it should be understood by those skilled in the art that the foregoing and various other changes, omissions, and additions may be made therein without departing from the spirit and scope of the invention.

I claim:

1. A printed circuit board (PCB) heat sink retainer, comprising:

a single-open-sided tubular, rectangular channel in a PCB chassis;

a plurality of rectangular-tubed wedges, each tube of each wedge having a pair of opposing rectangular sides and two congruently opposing trapezoidal sides formed by nonparallel, slanted end faces which mate with and slidably engage similarly slanted end faces of adjacent wedges alternately flipped for such engagement, said wedges being aligned end-to-end within said channel with a long side of a wedge facing, and in engagement with, a channel side opposite a channel side faced by a long side of a next adjacent wedge, said plurality of wedges including an entrance wedge fixed in position at a PCB insertion end of said channel and including a movable hollow end wedge, open at one end, at the other end of said channel; and a spring, one end of which rests against said other end of said channel, the other end of said spring being inserted within said movable hollow end wedge, and providing a preinsertion for slidably forcing the ends of said wedges against one another thereby causing oppositely directed lateral movement of alternate wedges and thereby forcing the long sides of alternate wedges against said facing channel sides such that upon insertion of a PCB heat sink between one of said facing channel sides and one set of alternate wedges, part of the spring force will be transmitted to and exerted by said one set of alternate wedges against a fully inserted heat sink and part of the spring force will be transmitted to and exerted by the other remaining set of alternate wedges against the other facing side of said channel.

2. The apparatus of claim 1, wherein said entrance wedge is settable to various fixed positions so as to provide the capability, by adjusting the position of the said entrance wedge, of exerting additional compressive forces on said plurality of wedges.

3. The apparatus of claim 2, wherein the position of said settable entrance wedge is settable by means of a set screw fixed in place with respect to the chassis.

4. The apparatus of claim 1, further comprising a wire, wherein each wedge of said plurality of wedges has a slot or bore through which said wire passes from one end of said channel to the other, said wire being anchored in each end of said channel for loosely holding said channel's wedges in longitudinal alignment and for preventing wedges from falling out of said channel.

5. The apparatus of claim 1, wherein the two edges at the end of the longest side of each trapezoidal wedge are chamfered.

6. The apparatus of claim 1, wherein the edge of each trapezoidal wedge closest to said entrance wedge is chamfered for easing sliding contact with a heat sink.

7. A printed circuit board (PCB) heat sink retainer, comprising:
 a PCB chassis channel;
 a plurality of trapezoidal wedges, aligned end-to-end in said channel; and
 spring means, within said channel, applying a longitudinal compressive force on said plurality of wedges to displace said wedges laterally, alternate wedges being displaced in opposite lateral directions and bearing upon opposing walls of said channel, wherein said plurality of wedges includes an end wedge disposed at open end of said channel and having a cavity therein, and wherein said spring means is a compression spring inserted in said cavity.

8. A printed circuit board (PCB) heat sink retainer, comprising:
 a PCB chassis channel;
 a plurality of trapezoidal wedges, aligned end-to-end in said channel; and
 spring means, within said channel, applying a longitudinal compressive force on said plurality of wedges to displace said wedges laterally, alternate wedges being displaced in opposite lateral directions and bearing upon opposing walls of said channel, wherein said spring means is located at an end of said channel opposite an end selected for PCB heat sink insertion.

9. A printed circuit board (PCB) heat sink retainer, comprising:
 a PCB chassis channel;
 a plurality of trapezoidal wedges, aligned end-to-end in said channel; and
 spring means, within said channel, applying a longitudinal compressive force on said plurality of wedges to displace said wedges laterally, alternate wedges being displaced in opposite lateral directions and bearing upon opposing walls of said channel, further comprising a wire, wherein each of said plurality of wedges has a slot or bore through which said wire passes from one end of said channel to the other, said wire being anchored in each end of said channel for loosely holding said wedges in longitudinal alignment and for preventing wedges from falling out of said channel.

* * * * *